(12) United States Patent
Cooper et al.

(10) Patent No.: US 8,097,535 B2
(45) Date of Patent: Jan. 17, 2012

(54) FABRICATION OF SELF-ASSEMBLED NANOWIRE-TYPE INTERCONNECTS ON A SEMICONDUCTOR DEVICE

(75) Inventors: Kevin Cooper, Hope Sound, FL (US); Srdjan Kordic, Biviers (FR)

(73) Assignee: NXP B.V., Eindhoven (NL)

( * ) Notice: Subject to any disclaimer, the term of this patent is extended or adjusted under 35 U.S.C. 154(b) by 496 days.

(21) Appl. No.: 12/439,734

(22) PCT Filed: Aug. 31, 2007

(86) PCT No.: PCT/IB2007/053517
§ 371 (c)(1),
(2), (4) Date: Mar. 3, 2009

(87) PCT Pub. No.: WO2008/029334
PCT Pub. Date: Mar. 13, 2008

(65) Prior Publication Data
US 2010/0052116 A1    Mar. 4, 2010

(30) Foreign Application Priority Data
Sep. 4, 2006   (EP) .................................... 06300918

(51) Int. Cl.
*H01L 21/00*   (2006.01)
(52) U.S. Cl. .......................... 438/622; 438/620; 438/621
(58) Field of Classification Search ........... 438/620–622
See application file for complete search history.

(56) References Cited

U.S. PATENT DOCUMENTS

| | | | |
|---|---|---|---|
| 4,144,139 A | 3/1979 | Durkee | |
| 4,690,714 A * | 9/1987 | Li | 438/24 |
| 6,323,432 B1 * | 11/2001 | Campbell et al. | 174/149 R |
| 6,518,168 B1 | 2/2003 | Clem | |
| 6,875,704 B2 | 4/2005 | Baek | |
| 6,911,378 B2 * | 6/2005 | Conti et al. | 438/475 |

(Continued)

FOREIGN PATENT DOCUMENTS

EP    1235227 A    8/2002

(Continued)

OTHER PUBLICATIONS

Dusberg, G. S.; "Carbon Nanotube Applications in Microelectronics"; Infineon Technologies AG; Corporate Research; Munich 81739; http://www.fkf.mpg.de/conf/heraeus/duesberg.pdf; pp. 1-55.

(Continued)

*Primary Examiner* — Laura Menz

(57) ABSTRACT

The present invention relates to a semiconductor device with nanowire-type interconnect elements and a method for fabricating the same. The device comprises a metal structure with at least one self-assembled metal dendrite and forming an interconnect element (424) between a first and a second metal structure. The fabrication comprises providing an ambient environment adjacent to an interconnect surface region of a substrate that is suitable for allowing growth of at least one metal dendrite between the first and second metal structures, and initiating and sustaining self-assembly of a metal structure comprising at least one metal dendrite in the interconnect surface region between the first and second metal structures by irradiating the pn junction with photons of an energy suitable for creating free charge carriers in the first and second doped substrate regions and thus creating an electric potential difference between the first and second metal structures, which is suitable for electrolysis of metal from at least one of the first and second metal structures.

12 Claims, 5 Drawing Sheets

U.S. PATENT DOCUMENTS

| | | | |
|---|---|---|---|
| 6,956,281 B2* | 10/2005 | Smith et al. | 257/659 |
| 7,015,580 B2* | 3/2006 | Fitzsimmons et al. | 257/739 |
| 7,064,053 B2* | 6/2006 | Kordic et al. | 438/597 |
| 7,188,630 B2* | 3/2007 | Flake et al. | 134/1.3 |
| 7,238,579 B2* | 7/2007 | Smith et al. | 438/277 |
| 7,579,279 B2* | 8/2009 | Flake et al. | 438/690 |
| 7,606,059 B2* | 10/2009 | Toda | 365/148 |
| 7,642,653 B2* | 1/2010 | Kuzuhara et al. | 257/758 |
| 7,655,563 B2* | 2/2010 | Brase et al. | 438/645 |
| 7,691,756 B2* | 4/2010 | Farkas et al. | 438/780 |
| 2004/0036150 A1* | 2/2004 | Smith et al. | 257/659 |
| 2004/0232551 A1* | 11/2004 | Moore et al. | 257/753 |
| 2005/0048697 A1 | 3/2005 | Uang et al. | |
| 2005/0093110 A1* | 5/2005 | Smith et al. | 257/660 |
| 2005/0233158 A1 | 10/2005 | Tour et al. | |
| 2005/0253220 A1 | 11/2005 | Lin et al. | |
| 2006/0017070 A1 | 1/2006 | Ikoma et al. | |
| 2006/0062924 A1* | 3/2006 | Horiuchi et al. | 427/430.1 |
| 2006/0270116 A1* | 11/2006 | Dangelo | 438/122 |
| 2007/0114657 A1* | 5/2007 | Dangelo et al. | 257/720 |
| 2007/0126116 A1* | 6/2007 | Dangelo et al. | 257/720 |
| 2008/0105947 A1* | 5/2008 | Kuzuhara et al. | 257/506 |
| 2009/0082216 A1* | 3/2009 | Cohn et al. | 506/9 |
| 2010/0052116 A1* | 3/2010 | Cooper et al. | 257/653 |

FOREIGN PATENT DOCUMENTS

WO    WO 2008029334 A1 *  3/2008

OTHER PUBLICATIONS

Ryan, Declan, et al; "Patterning Multiple Aligned Self-Assembled Monolayers Using Light"; American Chemical Society; Sep. 9, 2004; pp. 1-9.

* cited by examiner

FABRICATION OF SELF-ASSEMBLED NANOWIRE-TYPE INTERCONNECTS ON A SEMICONDUCTOR DEVICE

The present invention relates to a semiconductor device comprising a self-assembled metal interconnect element and a method for fabricating a self-assembled metal interconnect element on a substrate surface between a first metal structure and a second metal structure.

The continued reduction of the feature size in microelectronic devices calls for new methods to fabricate metal interconnect elements. Well-known lithography techniques have become very sophisticated and expensive since the feature size has moved below the wavelength of light used for irradiation of resist materials in the lithography process. X-ray and electron-beam lithography are very expensive candidates for providing high-resolution metal interconnect elements in microelectronic devices. An alternative method is provided by self-assembling nanometer-scale interconnect elements, also known as nanowires.

US 2005/0048697 A1 describes self-assembling of nanometer conductive bumps on the basis of carbon nanotubes on a substrate with a metal pad on its surface. Such conductive bumps serve to provide a conductive interface on chips in a systems-in-package that comprises several chips connected by flip-chip technology. However, miniaturization not only affects interface structures to external chips, but also interconnect elements within an interconnect stack of a semiconductor device like a microelectronic component. However, full integration of carbon nanotubes into established device processing technologies is still in its infancy.

US 2005/0233158 A1 suggests an electrical interconnect device that comprises an organic molecular coating, which is capable of forming electrically conducting self-assembled monolayers (SAM). A disadvantage of this technique is that such materials are difficult to integrate into highly developed semiconductor processing.

US 2005/0253220 describes a self-assembly of silicon nanowires and carbon nanotubes on a microelectronic device. Localized heating is employed to achieve a thermal requirement for vapor deposition synthesis. A disadvantage of this method is that it requires the preparation of a resistive structure for localized heating. Furthermore, the method is restricted to the growth of silicon nanowires and carbon nanotubes, while it is desirable to also be able fabricate metal interconnect elements.

U.S. Pat. No. 6,323,432 B1 describes a method for fabricating conductive dendrites for a compressible pad-on-pad connector. A particular substrate for growth of the dendrites is provided. After growing the dendrites, they are removed from the substrate by etching and subsequently incorporated into a compressible dielectric material. However, it is a tedious and expensive procedure to grow metal dendrites on one substrate and transfer them onto a target substrate.

The invention has a method aspect and a device aspect. For clarity of presentation, the method aspect will be explained first.

Thus, according to a first aspect of the invention, a method for fabricating a self-assembled metal interconnect element on a substrate surface between a first metal structure and a second metal structure is provided. The method comprises the steps of providing a semiconductor substrate with a pn junction formed by a first doped substrate region of a first conductivity type, and a second doped substrate region of an opposite second conductivity type;

fabricating a layer structure on the semiconductor substrate, the layer structure comprising the first metal structure, which is conductively connected with the first doped substrate region, and further comprising the second metal structure, which is conductively connected with the second doped substrate region, the layer structure allowing transmission of photons with an energy suitable for creating free charge carriers in the first and second doped substrate regions;

defining an interconnect surface region on the layer structure, which connects the first and second metal structures and which is designated for self-assembly of the metal interconnect element;

providing an ambient environment adjacent to the interconnect surface region and suitable for allowing growth of at least one metal dendrite between the first and second metal structures;

initiating and sustaining self-assembly of a third metal structure comprising at least one metal dendrite in the interconnect surface region between the first and second metal structures until the third metal structure forms the desired interconnect element, by irradiating the pn junction with photons of an energy suitable for creating free charge carriers in the first and second doped substrate regions and thus creating an electric potential difference between the first and second metal structures, which is suitable for electrolysis of metal from at least one of the first and second metal structures.

The method of the first aspect of the present invention provides a simple and effective way to fabricate a self-assembled interconnect element between the first and the second metal structures. The self-assembled metal interconnect element is formed by a third metal structure that comprises at least one self-assembled metal dendrite. The method can easily be integrated into known processing technologies, such as a CMOS or BiCMOS process.

The method makes use of the fact that irradiation of a pn junction connected with the first and second metal structures generates an electrical potential difference between the first and second metal structures that is higher the Nernst potential that required for electrolyzing the metal of the first or second metal structure.

The combination of the semiconductor material used for the pn junction and of the metal used for the first and second metal structures should therefore be chosen such that the potential generated within the semiconductor material by illumination with electromagnetic radiation is equal or higher than the Nernst potential of the particular metal. For example, illumination of a silicon pn junction with light of an energy that is higher than the bandgap of silicon creates electron-hole pairs and, therefore, a potential difference of about 800 mV between the p- and n regions. For a comparison, the Nernst potential for the process

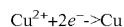

$$Cu^{2+}+2e^-\rightarrow Cu$$

is 337 mV. Therefore, by providing the connection between the pn junction and the first and second metal structures, as defined in the above method definition, a battery potential is provided, which is higher than the Nernst potential, leading to an electrolysis of Cu.

Therefore, according to a second aspect of the invention, a semiconductor device is provided, comprising:

a semiconductor substrate with a pn junction formed by a first doped substrate region of a first conductivity type, and a second doped substrate region of an opposite second conductivity type;

a layer structure on the semiconductor substrate, the layer structure comprising the first metal structure, which is conductively connected with the first doped substrate region, and further comprising the second metal structure, which is conductively connected with the second doped substrate region, the layer structure allowing transmission of photons with an energy suitable for creating free charge carriers in the first and second doped substrate regions; and a third metal structure comprising at least one self-assembled metal dendrite and forming an interconnect element between the first and second metal structures.

The semiconductor device of the second aspect of the invention forms the product achieved by the method of the first aspect of the invention.

Note that the term layer structure is used herein in a broad sense that covers various embodiments. The layer structure contains at least one layer on the semiconductor substrate. By way of example, a layer of an interconnect stack can form a layer structure according to the invention. However, a layer structure according to the present invention may also contain a stack of two or more single layers.

It is important that the layer structure allows transmission of photons with an energy suitable for creating free charge carriers in the first and second doped substrate regions. This can be achieved by letting the layer structure have transparent lateral sections, which are arranged so as to allow the transmission of light from the surface of the layer structure to the pn junction. Many dielectric materials, which are currently used for the fabrication of an interconnect stack in microelectronic devices, are suitable for allowing transmission of light. Care has to be taken that the layout of the layer structure on the semiconductor substrate provides a transmission path for the impinging light in order to create the electrical potential.

A differentiation between a third metal structure and an interconnect element is made here to distinguish between a fabrication stages, during which a metal structure is formed that initially does not electrically connect the first and the second metal structures yet, and a completed interconnect element, that does provide such electrical connection. Thus, it is after finishing the processing according to the method of the first aspect of the invention, the third metal structure forms an interconnect element between the first and second metal structures.

In the following, preferred embodiments of the method of the first aspect of the invention and of the semiconductor device of the second aspect of the invention will be described. The description first turns to the method of the first aspect of the invention. Here, four different embodiments, which provide different integration solutions into existing semiconductor processing technologies will be described in the following paragraphs.

According to a first embodiment that provides such an integration solution, the step of defining the interconnect surface region comprises fabricating a passivation layer on a surface of the layer structure except for the interconnect surface region, the passivation layer being suitable for avoiding growth of metal dendrites. The use of a passivation layer allows growing metal dendrites in the unpassivated surface regions, which form interconnect surface regions. Suitable materials that can form the passivation layer are, for instance, corrosion, inhibitors, self-assembled monolayers of suitable substances such as a polymer, or other materials known in the art, which can prevent the formation of metal dendrites.

Fabricating the passivation layer on the surface of the layer structure except for the interconnect surface region can be accomplished by first depositing and laterally structuring a resist layer by well-know lithographic processes. After lithography, the resist layer only covers those regions, which shall later on form the interconnect surface regions on the layer structure. After that, the passivation layer is fabricated. It may or may not cover the resist sections. Then, the resist-layer sections are stripped from the interconnect surface regions for initiating and sustaining the selective formation of metal dendrites in these unpassivated interconnect surface regions.

According to a second integration solution, which forms an alternative to the previous first integration solution, the step of defining the interconnect surface region comprises fabricating a resist layer and selectively removing the resist layer only in the desired interconnect surface region. The present embodiment uses a positive resist processing to form an opening in the resist layer only in the desired interconnect surface region (or regions). However, a negative resist can also be used. The advantage of this integration solution is that is allows a simplification of the further processing. In one embodiment the structured resist mask can be used during subsequent application of a surface coating that covers only the interconnect surface region. The surface coating is suitable for a stimulating self-assembly of the at least one metal dendrite. In this embodiment, the resist layer can be removed after the deposition of the surface coating.

It should be noted that the surface coating can also be applied in the first embodiment, using the passivation layer as a mask.

In a further embodiment, which forms a third integration solution, the positive resist treatment and the surface coating is followed by a step of removing the resist layer before the step of initiating and sustaining the self-assembly of the third metal structure. In this embodiment, the dendrite growth is performed selectively only in the region that is covered with the surface coating, i.e. the interconnect surface region.

In a further embodiment, which forms a fourth integration solution, the step of defining the interconnect surface region comprises
  etching a trench in the interconnect surface region
  fabricating a trench liner on a bottom face of the trench, the trench liner being suitable for preventing penetration of the metal of the first and second metal structures.

This embodiment allows fabrication of thicker interconnect elements by dendrite formation, which in a direction pointing away from the substrate are flush with the first and second metal structures they connect.

Undesired dendrites produced by this method in other substrate regions can be removed in a subsequent step of chemical mechanical polishing (CMP), which also may be useful in flattening the surface at the position of the interconnect element formed in the previous processing steps.

The following embodiments provide different alternatives of ambient environments. In a first embodiment, the step of providing an ambient environment comprises bringing the interconnect surface region in contact with an aqueous ambient environment to support the electrolysis.

In another embodiment the step of providing an ambient environment comprises bringing the interconnect surface region in contact with a solution of a metal. The solution can be an aqueous solution or use another suitable solvent known in the art of electrolysis. Care should be taken that a solvent is used, which does not attack other materials present in the device and exposed to the ambient environment.

In a further embodiment, the step of providing an ambient environment comprises bringing the interconnect surface region in contact with an ambient environment that has a first humidity level, and a step of adjusting to a second humidity level. In this embodiment, the humidity level can be changed to support the growth of a metal dendrite, and reduced for all other processing steps, as required by the respective processing steps.

For supporting initial growth of metal dendrites, the step of defining the interconnect surface region can be preceded by a step of incorporating metallic contamination into dielectric material extending between the first and second metal structures is performed, and wherein a step of removing the metallic contamination is performed after formation of the interconnect element.

A suitable light source for irradiation of the pn junction is for instance a laser. However, a lamp may be used as well.

The growth can be accelerated in an embodiment, in which either the first or the second or the first and the second metal structures are electrically charged before or during the step of initiating and sustaining a self-assembly of the third metal structure.

In the following, preferred embodiments of the semiconductor device of the second aspect of the invention will be described. It is understood that the embodiments can be combined with each other unless stated otherwise explicitly.

In one preferred embodiment, the layer structure forms an interconnect stack comprising a plurality of interconnect levels, and the first or second metal structure forms a metal via between adjacent interconnect levels in the interconnect stack. The present embodiment represents a further step in miniaturization of interconnect structures, which is achieved by rather uncomplicated processing means, as has been described above. The interconnect element that comprises self-assembled metal dendrites forms and interconnect element on a given interconnect level.

In a further embodiment, the pn-junction is formed by doped silicon regions The doped silicon regions are for instance formed by doped well regions in the substrate.

In a further embodiment of the semiconductor device, at least one of the first and second doped substrate regions forms a dummy substrate region, which does not have a function during operation of the semiconductor device. A function during operation of the semiconductor device is associated with the application purpose of the particular semiconductor device. Thus, a dummy substrate region has no influence during the operation of the electronic device. It can only have the purpose to allow fabrication of the third metal structure.

This way, the respective dummy substrate region is provided to allow formation of the third metal structure along a desired path on the layer structure even if an electronic circuit, which is formed in the substrate, would as such not allow the formation of the third metal structure along this desired trace. This embodiment thus increases the flexibility in the design of the third metal structure. It also allows increasing the length and the flexibility of routing of the third metal structure on the layer structure.

Furthermore, in one embodiment the semiconductor substrate comprises at least one dummy pn junction that does not have a function during operation of the semiconductor device and at least one pn junction that does have a function during operation of the semiconductor device, and wherein respective first and second metal structures connected with respective first and second substrate regions of a respective pn junction are arranged along a trace of the third metal structure on the layer structure so as to form connections to the substrate regions according to an alternating sequence of the type pnpn etc. or npnp etc. A dummy pn junction that does not have a function during operation of the semiconductor device is for instance arranged outside any electronic circuit that forms a part of the application implemented by the semiconductor device, or is electrically isolated from such an electronic circuit.

Note that it is also possible to build the third metal structure only on the basis of dummy pn junctions.

The third metal structure may be formed of metal dendrites only. Alternatively, it may contain additional metal that is not self-assembled in the form of dendrites.

The third metal structure and at least one of the first and the second metal structures preferably comprise copper Cu. Copper is the currently preferred metal for interconnect elements because of its low resistance and low price. Furthermore, the Nernst potential of Cu is low enough to allow performing the processing of the invention with visible light, which is easy to provide.

In the following, further embodiments of the invention will be described with reference to the figures.

Figure 1:
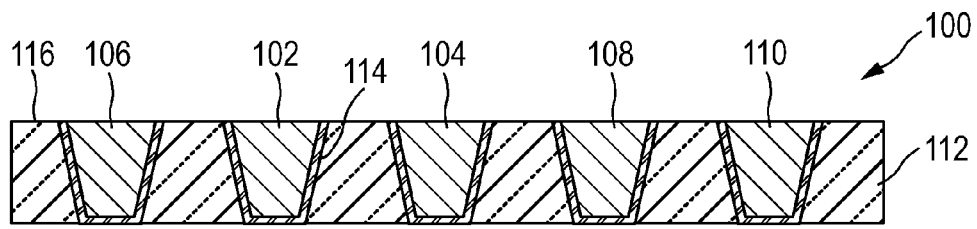
FIGS. 1-5 show a cross-sectional view of a section of an interconnect stack at different stages during formation of an interconnect element according a first embodiment of the method of the invention.

FIG. 1 shows a cross-sectional view of a layer structure 100 that forms a layer in an interconnect stack, which is arranged on a semiconductor substrate (not shown). The layer structure 100 comprises a first metal structure in the form of a first Cu line 102 and second metal structure in the form of a second Cu line 104. Further Cu lines 106 to 110 are shown. The arrangement of the Cu lines 102 to 110 is completely exemplary in nature. The Figure only serves to illustrate the present first embodiment of a method for forming an interconnect element between the first Cu line and the second Cu line 104. The arrangement of Cu lines in real semiconductor devices follows the specific needs of the particular electronic circuit, which is implemented in the semiconductor device. A person skilled in the art knows how to translate the technical teaching given with reference to this exemplary layer structure into a real device.

The Cu lines 102 to 110 are embedded in a dielectric material 112. Since Cu outdiffusion from the lines 102 to 110 can create problems in device reliability, a liner, an example of which is shown by reference label 114, is arranged between each Cu line and the surrounding dielectric material 112. A suitable material for the liner is TiN or TaN. The layer structure 100 shown in FIG. 1 can be fabricated by well-known techniques, such as a dual-damascene technique. In the process of fabricating an interconnect stack, the processing stage shown in FIG. 1 corresponds to a situation after performing a chemical mechanical polishing (CMP) of the surface. At this stage, a surface 116 of the layer structure 100 is unpassivated.

It is assumed that the first Cu line is conductively connected with a first doped region in the substrate (not shown). An example of connection between the Cu lines and the substrate of will be given further below in FIG. 20. The first doped region has a first conductivity type such as p-conductivity. The conductive connection with the p-doped substrate region is provided by underlying interconnect elements and vias, as is well-known for interconnect structures. The second Cu line 104 is assumed to be conductively connected with a second doped substrate region, which has the opposite conductivity type in comparison with the first doped region. Therefore, in the present example, the Cu line is connected with n-doped region of the substrate. The doped substrate regions can for instance be doped wells or shallow regions such as source and drain regions of field effect transistors (FETs). They form a pn junction.

For the purpose of the present example, it is further assumed that a third metal structure in the form of an interconnect element is to be formed between the first and second Cu lines 102 and 104.

Figure 2:
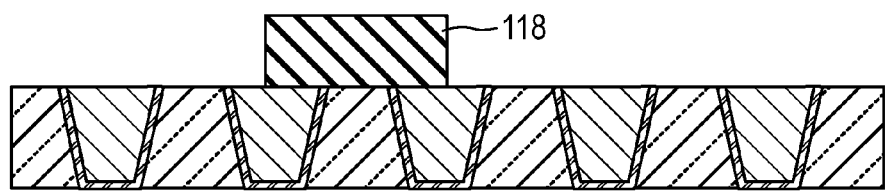

In a first step, the result of which is shown in FIG. 2, a resist layer is deposited on the surface 116 and structured by lithographic techniques to obtain a resist mask 118 that covers the region, in which the interconnect element is to be formed. This region is herein referred to as the interconnect surface region. The interconnect surface region defined in the processing by specific mask processing may be slightly larger than the actual interconnect element that is fabricated.

Figure 3:
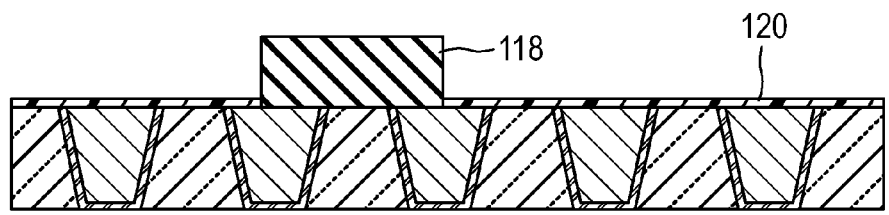

FIG. 3 shows the layer structure of FIG. 2 after a subsequent step of depositing a passivation layer 120. The passivation layer covers the substrate surface 116 except for the region covered by resist mask 118. Suitable materials for the passivation layer are for instance corrosion inhibitors such as ethylene glycol, polyethylene glycol (PEG), polypropylene glycol (PPG), block co-polymer, polypropylene oxides (PPO), polyethylene oxide (PEO), ammonium dodecyl sulfate, alkyl phenol ether phosphate, amino ethyl imadazoline, benzotriazole (BTA), triazole, therophylline, bipyridyl, or other suitable materials in the form of a self-assembled monolayer (SAM).

Figure 4:
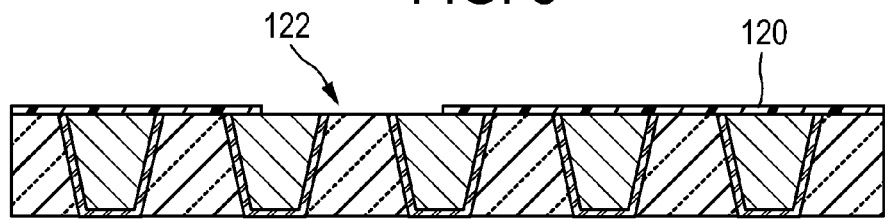

In a next step, the result of which is shown in FIG. 4, the resist mask 118 is stripped, for instance by a selective etching or a dissolving step, that leaves the passivation layer 120 and the underlying layer structure 100 in tact. At this stage, an interconnect surface region 122 is defined by an opening in the passivation layer 120, which was previously covered by the resist mask 118.

Figure 5:
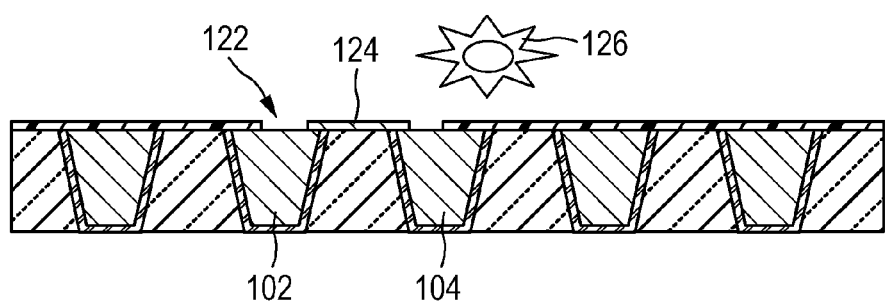

In a next step, self-assembly of metal dendrites is initiated and sustained in a suitable ambient environment, selectively in the interconnect surface region 122, leading to the formation of a third metal structure 124, cf. FIG. 5. To this end, the pn-junction formed by the p- and n-type substrate regions is exposed to irradiation, which is symbolized by a "light flash" or "sun" symbol 126.

The light source emits light, which has an energy that is suitable for creating free charge carriers in the doped substrate region connected with the first and second Cu lines 102 and 104. Free charge carriers are created by absorption of light of an energy that is above the band gap energy of the semiconductor material in the doped substrate regions. The generated charge carriers are separated by the built-in potential of the pn-junction and create an electric potential difference between the first and second Cu lines 102 and 104. The potential difference is high enough to initiate an sustain electrolysis of Cu from the first or second Cu lines 102, 104. In silicon, a potential difference of approximately 800 meV is generated by irradiation with light above the band-gap energy of 1.1 eV. Thus, the visible and near infrared spectral range of electromagnetic radiation up to a wavelength of approximately 1000 nm can be used for initiating and sustaining this process.

Of course, the light source could also irradiate the pn-junction with a spectrum that in addition covers energies below the band-gap energy. However, the energy spectrum and spectral intensity distribution of the light should be chosen so as to generate sufficient numbers of charge carriers without heating the substrate more than necessary, and in particular not beyond the tolerable thermal budget.

It should be noted that the dielectric material 112 is selected to be transparent or partly transparent in the suitable spectral range. In real device structures, metal structures that may be arranged under the layer structure 100 should not cover the underlying semiconductor substrate to an extent that can block penetration of at least some of the irradiated light to the respective pn junctions.

The process is performed in a suitable ambient atmosphere, for instance by bringing the interconnect surface region in contact with an aqueous ambient environment, that in one embodiments contains solved Cu ions.

The electrolyzed Cu created in this process migrates along the surface 116 between the two Cu lines and reassembles in the form of at least one Cu dendrite that generally grows in a direction corresponding to that of the potential difference. The passivation layer 120 prevents growth of metal dendrites in other regions than the interconnect surface region 122.

The self-assembly of Cu dendrites is sustained until an interconnect element with properties suitable for device operation has been formed. The duration of the metal dendrite formation depends the desired geometrical parameters of the interconnect element, which can be selected in dependence on the maximum current density expected to be transported by the interconnect element 124. In one embodiment, the larger the current, the longer is the metal dendrite formation sustained to obtain a thicker interconnect element with increased stability.

FIGS. 6 to 10 show a cross-sectional view of a section of an interconnect stack at different stages during formation of an interconnect element, according a second embodiment of the method of the invention.

Figure 6:
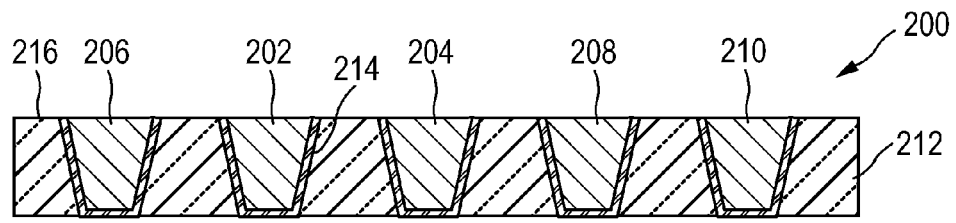
FIGS. 6-10 show a cross-sectional view of a section of an interconnect stack at different stages during formation of an interconnect element according a second embodiment of the method of the invention.
Figure 7:
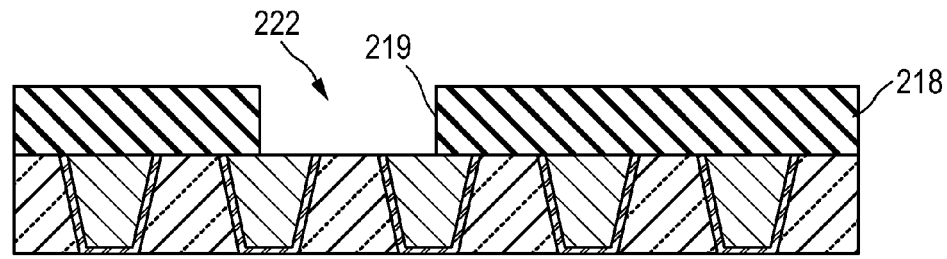
Figure 8:
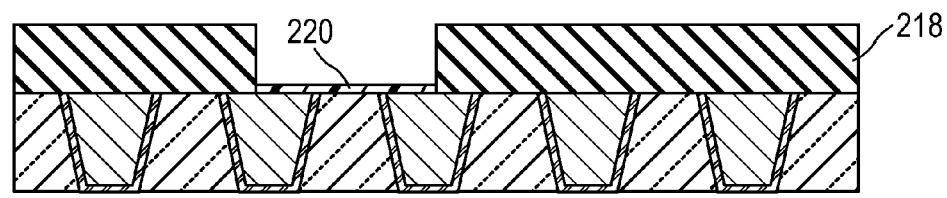

The basic structure shown in FIG. 6 is identical to that of FIG. 1. However, to emphasize the different processing used in this method embodiment reference labels are used that have the first digit changed from "1" to "2" in comparison with the structure of FIG. 1. Unless stated otherwise explicitly, the structural elements present in the method embodiment to be described are identical to those that have been described in the context of the previous embodiment of FIGS. 1 to 5. The following description focuses on the differences in processing. As can be seen in FIG. 7, the present embodiment uses a positive resist processing to define an opening 219 in a resist layer 218 that has been deposited on the surface 216 of the interconnect layer 200. The opening 219 forms an interconnect surface region 222, in which during later processing steps a metal structure will be formed that contains Cu dendrites. After formation of the opening 219, a surface coating 220 is deposited on the surface of the interconnect layer 200. The surface coating serves to support the growths of Cu dendrites in later processing steps. A suitable surface coating material is for instance a Silane coupling agent, or a self-assembled monolayer of a suitable material. In this step, the resist layer 218 acts as a mask to protect surface regions other than from the interconnect surface region 222 from being exposed to the surface coating.

Figure 9:
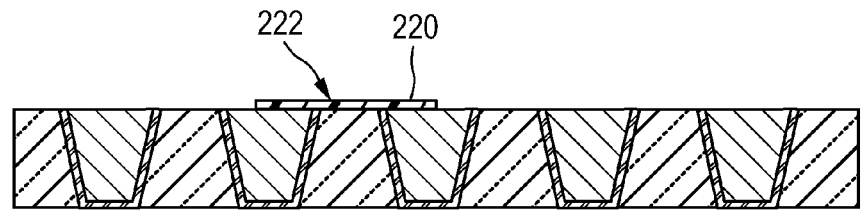
Figure 10:
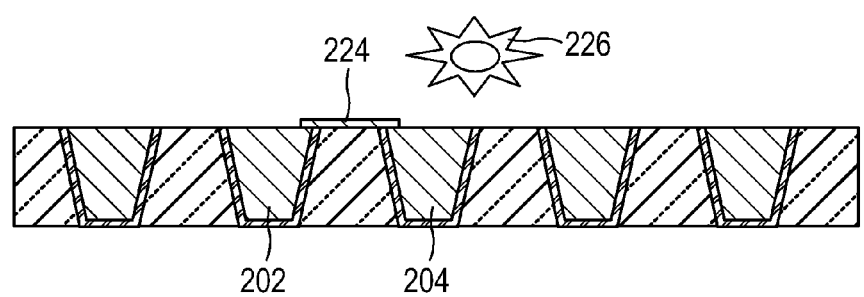

In a next step, the result of which is shown in FIG. 9, the resist layer 218 is removed. Note that as an alternative this removal step can be performed at a later processing stage. If the resist layer 218 is not removed at the present stage, it will protect the regions where dendrite growth is unwanted. The resist layer can then be removed after dendrite growth.

Subsequently, the growth of a third metal structure between the first Cu line 202 and the second Cu line 204 is initiated and sustained by irradiation of the pn-junction connected with the Cu lines with light of a suitable wave length. The third metal structure can have a length of several micrometers between the two Cu lines 202 and 204. Larger distances are difficult to bridge by dendrite growth without further Cu structures. Therefore, for providing the third metal structure over a longer distance, more Cu lines can be provided, which may be connected to a respective dummy p- or n-type region or, for a pair of Cu lines, to a dummy pn junction. This way, the circuit design can be performed almost independently from the design of the interconnect stack.

FIGS. 11 to 15 show a cross-sectional view of a section of an interconnect stack at different stages during formation of an interconnect element according a third embodiment of the method of the invention.

Figure 11:
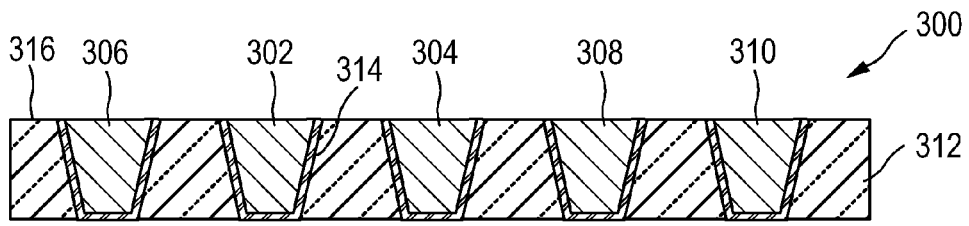
FIGS. 11-15 show a cross-sectional view of a section of an interconnect stack at different stages during formation of an interconnect element according a third embodiment of the method of the invention.
Figure 12:
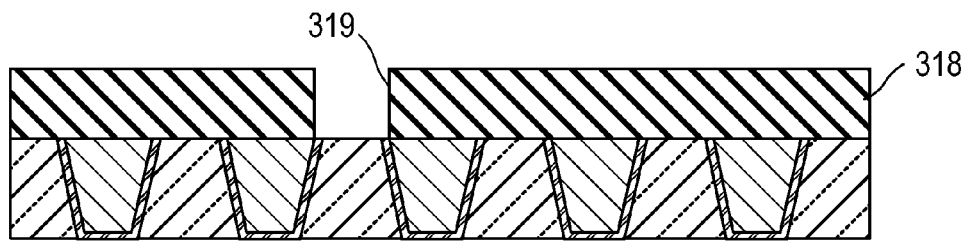
Figure 13:
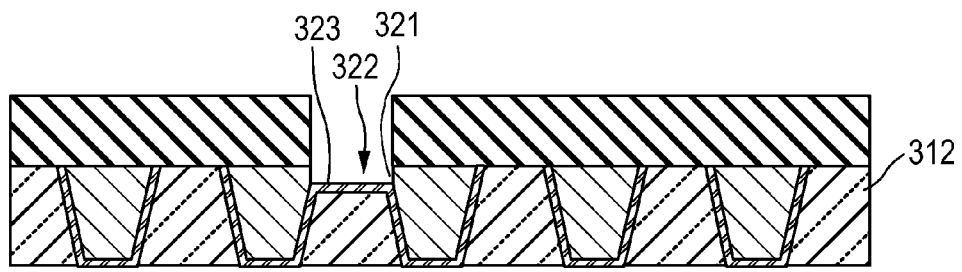

The layer structure 300 shown in FIG. 11 is identical to that in FIGS. 6 and 1. Again, to emphasize that a different processing is used in the present method embodiment, reference labels are used that have a first digit "3" but use identical second and third reference labels for like parts in comparison with FIGS. 1 and 6. Where differences exist in the structure element despite similar reference labels, these differences are explicitly described or obvious from a respective figure.

In the present processing embodiment, an interconnect element 324 is to be formed between the first Cu line 302 and the second Cu line 304. To this end, a resist mask 318 is formed by depositing a resist layer and forming an opening 319 in the resist layer, cf. FIG. 12. The processing is similar with that shown in FIG. 7. Note, however, that the opening 319 is smaller than the opening 219 and only extends over dielectric material and does not leave any parts of the first and second Cu lines 302 and 304 uncovered.

In a subsequent processing step, a trench 321 is formed in the dielectric material 312 at the position of the opening by known etching techniques. A bottom wall of the trench 321 is covered with a TiN liner 323. It serves at a diffusion barrier for copper, as described before for the TiN liner 314 (see description for liner 114 of FIG. 1).

Figure 14:
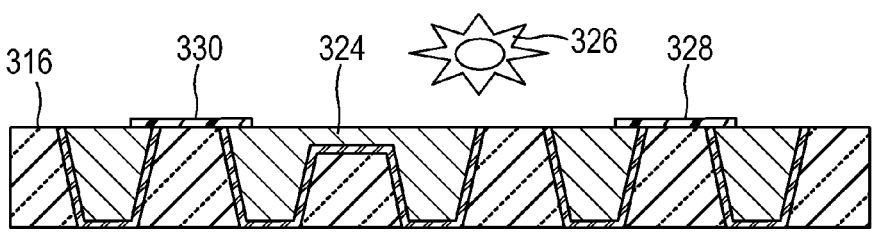
Figure 15:
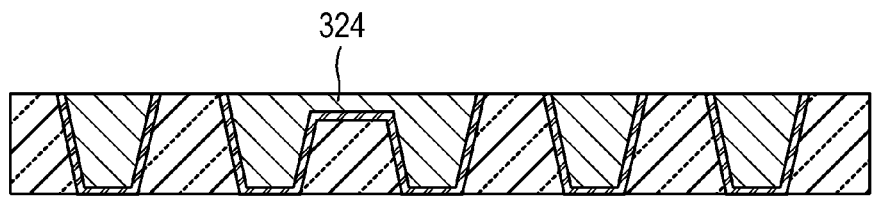

Subsequently, as can be seen in FIG. 14, the resist mask 318 is stripped from the surface 316 of the layer structure 300, and growth of a third metal structure comprising Cu dendrites is initiated and sustained by irradiation with light of a suitable energy and intensity. Note again that as an alternative the removal step can be performed at a later processing stage. If the resist mask 318 is not removed at the present stage, it will protect the regions where dendrite growth is unwanted. The resist mask 318 can then be removed after dendrite growth.

The growth of the third metal structure 324 is sustained until it is flush with the surface 316. At this stage, unwanted dendrite formation may occur, which is indicated by reference labels 328 and 330. Such unwanted dendrites might lead to short circuits. Therefore, a CMP step is performed subsequently to the dendrite growth to remove all unwanted metal from the surface 316 and to provide a perfectly flat surface.

FIGS. 16-19 show a cross-sectional view of a section of an interconnect stack at different stages during formation of an interconnect element according a fourth embodiment of the method of the invention.

Figure 16:
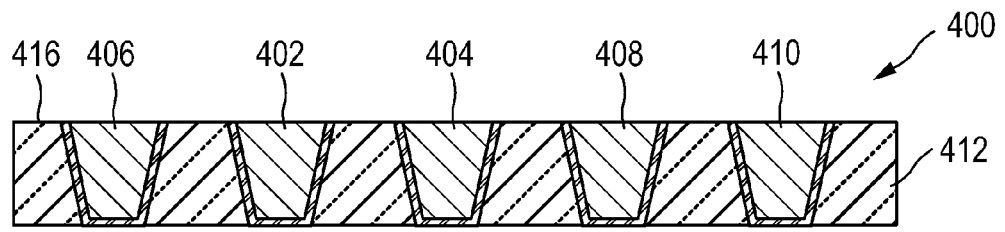
FIGS. 16-19 show a cross-sectional view of a section of an interconnect stack at different stages during formation of an interconnect element according a fourth embodiment of the method of the invention.
Figure 17:
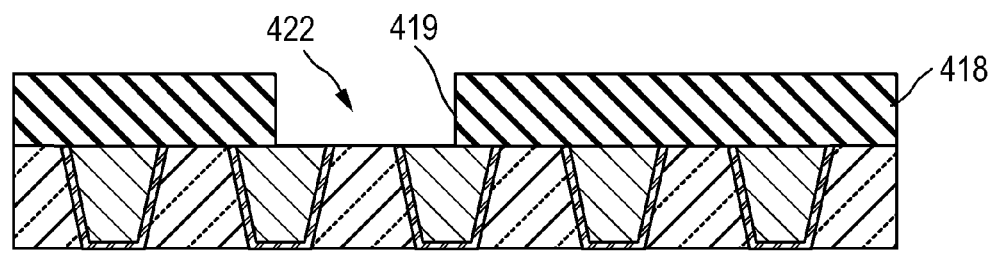

Again, the layer structure 400 of FIG. 16 is the same as that of FIGS. 1, 6, and 11. In the present embodiment, reference labels in the range of 400 are used in the same manner as explained for the previous embodiments.

The processing starts with the deposition and lithography of a resist layer to obtain a resist mask 418 with an opening 419 that defines an interconnect surface region 422. The opening extends over the distance between the first and second Cu lines 402 and 404 and also leaves some of the surface area of these Cu lines open, as in the example of FIG. 7.

Figure 18:
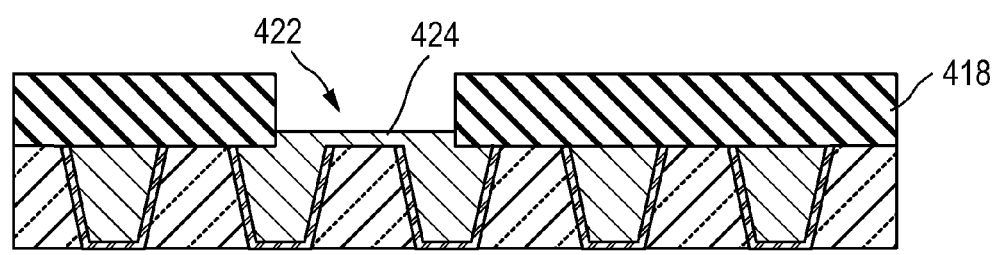
Figure 19:
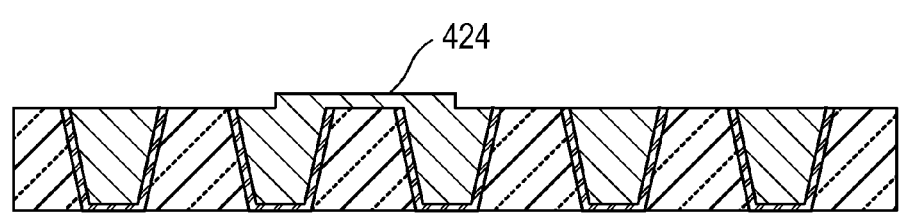

In a subsequent step, Cu dendrites are formed in the interconnect surface region to form a third metal structure 424 resulting in an interconnect element after stripping of the resist mask 418 (cf. FIGS. 18 and 19).

Figure 20:
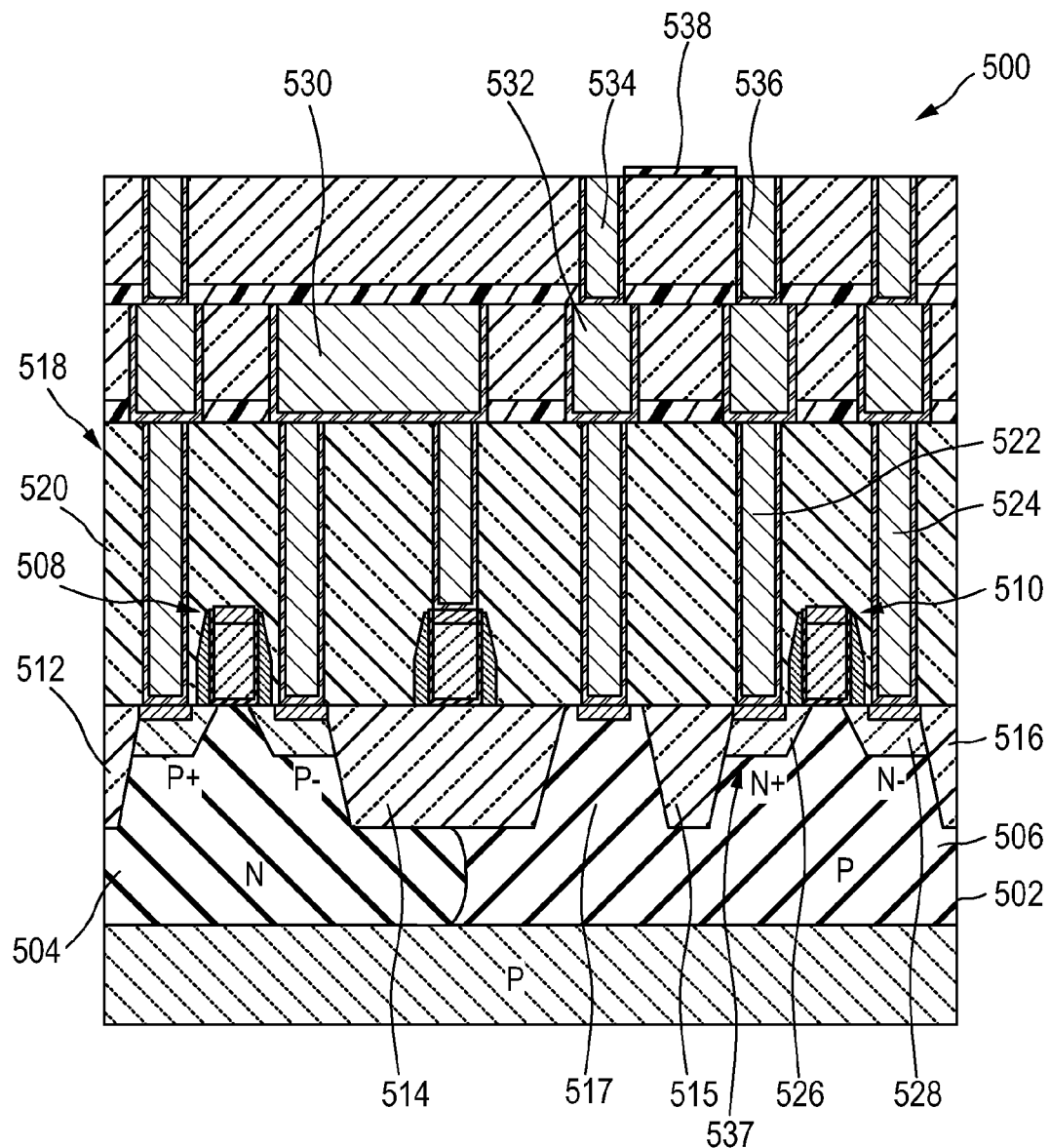
FIG. 20 shows a cross-sectional view of an exemplary semiconductor device according to an embodiment of the invention.

FIG. 20 shows a cross-sectional view of an exemplary semiconductor device 100 according to an embodiment of the invention.

The semiconductor device 500 comprises a substrate 502, which is made of p-type silicon. In the substrate, electronic device structures are formed by known methods of semiconductor processing techniques. The semiconductor device 500 is a CMOS (Complementary Metal-Oxide-Semiconductor) device comprising n-well and p-well regions 504 and 506, respectively, in which electronic devices are formed.

The semiconductor device 500 in the cross-sectional view of FIG. 20 is of purely explanatory nature. The device structure shown need not be present in a semiconductor device according to the invention. In the present example, NMOS and PMOS field effect transistors (FETs) 508 and 510 are provided, which are separated by field oxide regions 512, 514, 515, and 516.

An interconnect stack 518 is deposited on the substrate and embeds the electronic devices in dielectric material 520. The electronic devices such as the NMOS and PMOS FET 508 and 510, respectively, are contacted by tungsten (W) plugs, such as tungsten plugs 522 and 524, which are connected with source and drain regions 526 and 528 of PMOS FET 510.

On top of the dielectric layer, typically, a multilevel interconnect structure is formed using Cu interconnect elements, such as interconnect elements 530 and 532, and Cu lines, such as Cu lines 534 and 536. Cu line 534 is connected to the P-well 506, and Cu line 536 is connected with N-doped region 526. A pn junction 537 is formed between P-well 506 and N-doped region 526.

In the exemplary structure of FIG. 20, only one metal level is shown for reasons of simplicity of presentation. Additional metal levels are typically present in a semiconductor device. For example, some semiconductor devices contain up to seven metal levels. The invention can be applied on each metal level.

In the semiconductor device 500 of FIG. 20, the lines 534 and 536 form a first and a second metal structure. An interconnect element 538 is formed between them, which comprises Cu dendrites.

In addition, p+ and n+ regions (not shown) can be integrated so that they form a junction, and dendrites will grow between Cu contacting these regions. The same can be done with n- and p-wells.

While the invention has been illustrated and described in detail in the drawings and foregoing description, such illustration and description are to be considered illustrative or exemplary and not restrictive; the invention is not limited to the disclosed embodiments. For instance, growing dendrites between metal vias in an interconnect stack is also possible, for example in a process, where only the via level is fabricated, the dendrites are grown, and the line fabrication is performed subsequently.

Other variations to the disclosed embodiments can be understood and effected by those skilled in the art in practicing the claimed invention, from a study of the drawings, the disclosure, and the appended claims. The metal used is not restricted to Cu. Other metals can be used as well, such as Al, W, or highly-doped (metallically conductive) Silicon. Also, the semiconductor material used need not be Silicon. Generally, any semiconductor can be used, also alloys formed of different semiconductors, such as SiGe, the InAlGaAs alloy system, the InGaAlN alloy system, or others known in the art.

In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage.

Any reference signs in the claims should not be construed as limiting the scope.

The invention claimed is:

1. A method for fabricating an interconnect element on a substrate surface between a first metal structure and a second metal structure, comprising the steps of
    providing a semiconductor substrate with a pn junction formed by a first doped substrate region of a first conductivity type, and a second doped substrate region of an opposite second conductivity type;
    fabricating a layer structure on the semiconductor substrate, the layer structure comprising the first metal structure, which is conductively connected with the first doped substrate region, and further comprising the second metal structure, which is conductively connected with the second doped substrate region, the layer structure allowing transmission of photons with an energy suitable for creating free charge carriers in the first and second doped substrate regions;
    defining an interconnect surface region on the layer structure, which connects the first and second metal structures and which is designated for self-assembly of the metal interconnect element;
    providing an ambient environment adjacent to the interconnect surface region and suitable for allowing growth of at least one metal dendrite between the first and second metal structures;
    initiating and sustaining self-assembly of a third metal structure comprising at least one metal dendrite in the interconnect surface region between the first and second metal structures until the third metal structure forms the desired interconnect element, by irradiating the pn junction with photons of an energy suitable for creating free charge carriers in the first and second doped substrate regions and thus creating an electric potential difference between the first and second metal structures, which is suitable for electrolysis of metal from at least one of the first and second metal structures.

2. The method of claim 1, wherein the step of defining the interconnect surface region comprises fabricating a passivation layer on a surface of the layer structure except for the interconnect surface region, the passivation layer being suitable for avoiding growth of metal dendrites.

3. The method of claim 1, wherein the step of defining the interconnect surface region comprises fabricating a resist layer and selectively removing the resist layer only in the desired interconnect surface region.

4. The method of claim 1, wherein the step of defining the interconnect surface region comprises fabricating a surface coating that covers only the interconnect surface region, the surface coating being suitable for stimulating self-assembly of the at least one metal dendrite.

5. The method of claim 4, wherein the step of defining the interconnect surface region comprises removing the resist layer before the step of initiating and sustaining.

6. The method of claim 1, wherein the step of defining the interconnect surface region comprises
    etching a trench in the interconnect surface region
    fabricating a trench liner on a bottom face of the trench, the trench liner being suitable for preventing penetration of the metal of the first and second metal structures.

7. The method of claim 4, wherein a step of mechanical electrical polishing is performed after the self-assembly of the at least one metal dendrite in the trench.

8. The method of claim 1, wherein the step of providing an ambient environment comprises bringing the interconnect surface region in contact with an aqueous ambient environment.

9. The method of claim 1, wherein the step of providing an ambient environment comprises bringing the interconnect surface region in contact with a solution of a metal.

10. The method of claim 1, wherein the step of providing an ambient environment comprises bringing the interconnect surface region in contact with an ambient environment that has a first humidity level, and a step of adjusting to a second humidity level.

11. The method of claim 1, wherein, before the step of defining the interconnect surface region, a step of incorporating metallic contamination into dielectric material extending between the first and second metal structures is performed, and wherein a step of removing the metallic contamination is performed after formation of the interconnect element.

12. The method of claim 1, wherein the step of initiating and sustaining self-assembly of the third metal structure comprises electrically charging either the first or the second or the first and the second metal structures.

* * * * *